United States Patent
Feldtkeller (10) Patent No.: US 8,638,048 B2
(45) Date of Patent: Jan. 28, 2014

(54) CIRCUIT FOR DETERMINING AN AVERAGE VALUE

(75) Inventor: Martin Feldtkeller, Munich (DE)

(73) Assignee: Infineon Technologies AG, Neubiberg (DE)

( * ) Notice: Subject to any disclaimer, the term of this patent is extended or adjusted under 35 U.S.C. 154(b) by 294 days.

(21) Appl. No.: 13/084,595

(22) Filed: Apr. 12, 2011

(65) Prior Publication Data

US 2012/0262086 A1    Oct. 18, 2012

(51) Int. Cl.
*G05F 1/00* (2006.01)
*G06F 7/64* (2006.01)
*G06G 7/12* (2006.01)

(52) U.S. Cl.
USPC ............................ 315/297; 327/345; 327/363

(58) Field of Classification Search
USPC .................................. 327/345, 363; 315/291
See application file for complete search history.

(56) References Cited

U.S. PATENT DOCUMENTS

| | | | |
|---|---|---|---|
| 2006/0158364 A1* | 7/2006 | Boemler | 341/155 |
| 2007/0109048 A1* | 5/2007 | Inoue | 330/200 |
| 2008/0240301 A1* | 10/2008 | Mandal et al. | 375/340 |
| 2011/0025301 A1 | 2/2011 | Feldtkeller | |

FOREIGN PATENT DOCUMENTS

| | | |
|---|---|---|
| DE | 102010038557 A1 | 2/2011 |
| EP | 0852453 A1 | 7/1998 |

* cited by examiner

*Primary Examiner* — Thienvu Tran (57) ABSTRACT

A circuit for determining an average value of a quasiperiodic signal may include an integrator, a sample and hold circuit coupled to an output of the integrator, wherein the sample and hold circuit includes a sample and hold circuit output, a feedback path coupled to the sample and hold circuit output and configured to feedback the signal provided at the sample and hold circuit output as a feedback signal, a subtractor configured to form a difference signal representing the difference between the quasiperiodic signal and the feedback signal, wherein an output of the subtractor is coupled to an input of the integrator to thereby provide the difference signal to the input of the integrator.

29 Claims, 4 Drawing Sheets

CIRCUIT FOR DETERMINING AN AVERAGE VALUE

TECHNICAL FIELD

Various embodiments relate generally to a circuit for determining an average value of periodic or quasiperiodic signals.

BACKGROUND

The averaging of periodic or quasiperiodic signals is nowadays a feature often implemented in various kinds of circuits. For example, an average value of a current multiplied with a supply voltage of a half-bridge circuit can be taken as a measure of an effective power that is output by the half-bridge circuit. The averaging is mostly conducted by means of an RC-filter. The averaging may be also performed by the means of an ADC (analog-to-digital-converter) and a digital filter.

A major disadvantage of the averaging by the means of an RC-filter is that a compromise has to be found between the ripple of the obtained average value and the settling time of the filter. In particular, when closed loop control circuits are considered, the signal delay time has to be short and thus the delay introduced by an RC-filter would significantly affect the achievable control dynamics.

Averaging performed by digital processing would require a very fast ADC due to the high spectral components within the current of the half-bridge circuit. This, however, might lead to a very high current consumption in many applications.

In the light of the problems just described, a circuit for determining an average value is to be provided which, in case it is used in combination with a ADC connected downstream to it, may require only one transformation by the ADC during a half-bridge cycle and further may be able to adjust its output in accordance with changes in the half-bridge current with only a short signal delay.

SUMMARY

In accordance with various embodiments, a circuit for determining an average value of a quasiperiodic signal is provided. The circuit may include an integrator, a sample and hold circuit coupled to an output of the integrator, wherein the sample an hold circuit may include a sample and hold circuit output, a feedback path coupled to the sample and hold circuit output and configured to feedback the signal provided at the sample and hold circuit output as a feedback signal, a subtractor configured to form a difference signal representing the difference between the quasiperiodic signal and the feedback signal, wherein an output of the subtractor is coupled to an input of the integrator to thereby provide the difference signal to the input of the integrator.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In order to determine an average value of a quasiperiodic signal, the circuit for determining an average value of a quasiperiodic signal according to various embodiments (in the following the circuit) may include an element configured to form a difference signal based on the difference between an input signal of the circuit and a variable feedback signal, wherein the feedback signal may be derived from an output signal of the circuit. The difference signal may be provided to an integrator which has a switchable input. The signal output by the integrator may be fed to a sample and hold (in the following also referred to as S/H) stage which is configured to provide the output signal received from the integrator at the output of the circuit.

The circuit according to various embodiments, as will become more clear in the course of the description, may be used to determine the effective power of a half-bridge circuit, which is commonly used in LLC converters, so-named for their use of use of two inductors (LL) and a capacitor (C), or ballast circuits for fluorescent lamps. Moreover, the circuit according to various embodiments may be generally used for determining an average value of a quasiperiodic signal.

Figure 1:
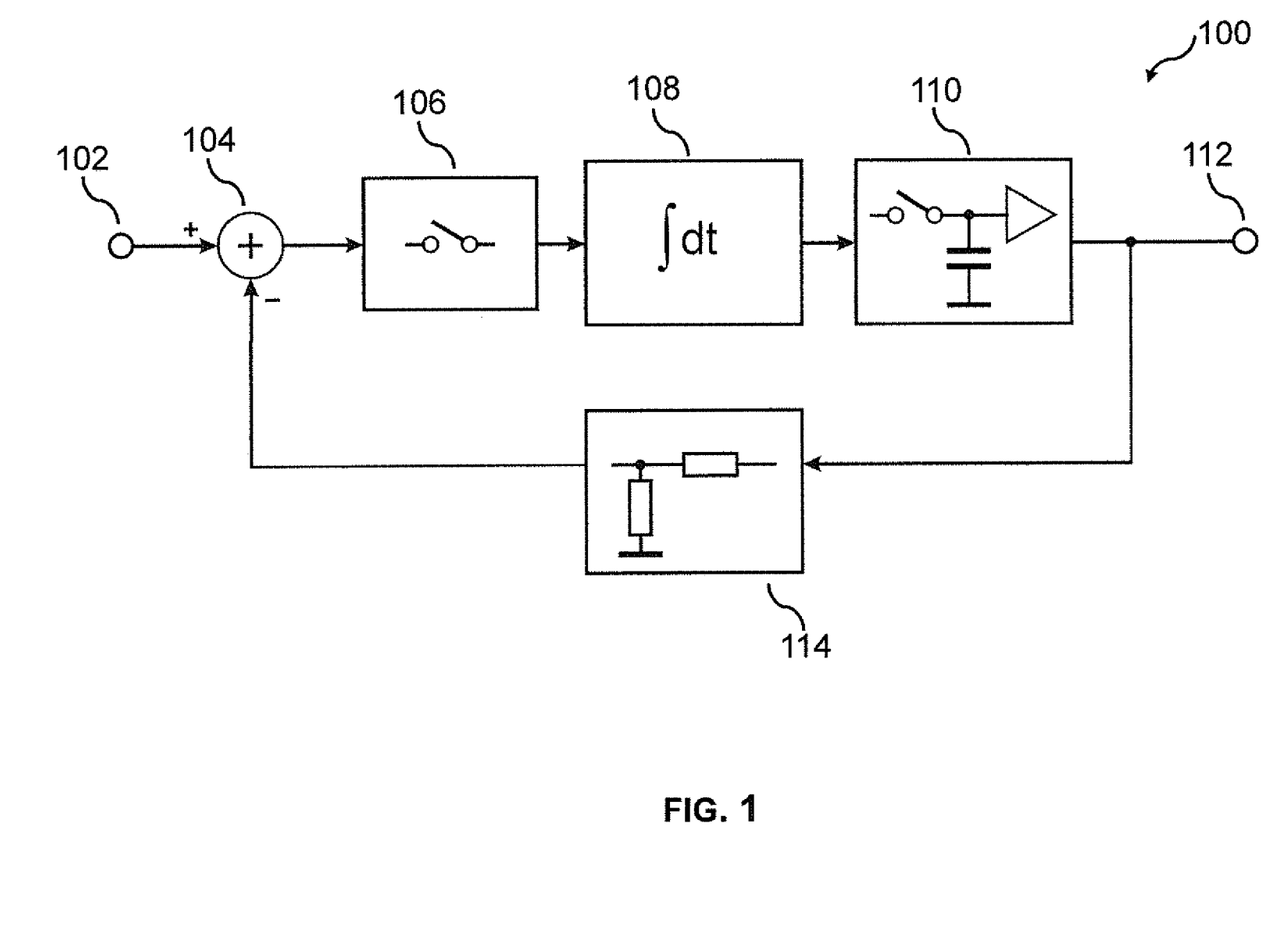
FIG. 1 shows an implementation of a circuit for determining an average value of a quasiperiodic signal in accordance with various embodiments.

In FIG. 1 an implementation of the circuit 100 for determining an average value of a quasiperiodic signal in accordance with various embodiments is shown. The circuit 100 includes an input 102 which is coupled to a first input of a subtractor 104 which may be a positive input, i.e. a signal provided at the first input of the subtractor 104 may represent a minuend signal. The subtractor 104 has a second input which may be a negative input to which an output 112 of the circuit 110 may be coupled as a feedback signal, i.e. a signal provided at the second input of the subtractor 104 may be a subtrahend signal. An attenuator 114 as an optional component may be interposed between the output 112 of the circuit 110 and the second input of the subtractor 104 such that an output signal of the circuit may be attenuated or scaled down before being applied to the second input of the subtractor 104. An output of the switch 106 is coupled to an input of an integrator 108 via a switch 106 such that the output of the subtractor 104 is coupled to the input of the integrator 108 in a switchable manner. An output of the integrator 108 is coupled to an input of a S/H circuit 110 and an output of the S/H circuit 110 is coupled to the output 112 of the circuit 100.

The circuit 100 may be used in environments which provide a quasiperiodic signal to be averaged which features time intervals during which the signal is zero at least during regular operation. In various embodiments, a quasiperiodic signal may be understood to be a signal where changes in levels, timings or frequency from one cycle to the next cycle are small compared to absolute levels, timings or the absolute frequency.

The switch 106 may be configured to be opened (i.e. set into a non-conducting state) during time periods or time intervals (switch-off time intervals in the following) which are in a fixed proportion to the cycle duration of the input signal, i.e. the ratio of the switch-off time interval to the cycle duration of the input signal may be predefined or fixed. The switch-off time intervals may lie within time intervals during which the input signal is zero.

The S/H circuit 110 may be configured to acquire or sample the output signal of the integrator 108 once during each of the switch-off time intervals, i.e. time intervals during which the input of the integrator 108 is deactivated as it is disconnected from the output of the subtractor 104 due to the switch 106 being opened.

The amplification factor of the integrator 108 may be configured such that the integration of a voltage difference $\Delta V$ between the respective signals applied to the inputs of the subtractor 104 over a period of time which corresponds to the time interval during which the input of the integrator 108 is activated (i.e. the time interval during which the switch 106 is closed or in a conducting state) results in an output signal being output by the integrator 108 and optionally scaled by the attenuator 114 before being fed back into the subtractor 104 such that a voltage change that is equal to $\Delta V$ is effected at the second input of the subtractor 104. In other words, the amplification factor of the integrator 108 is adjusted such that the integration over a certain time period of a constant signal of amplitude $\Delta V$ provided at the input of the integrator 108 would lead to a change of the signal provided at the second input of the subtractor 104 by $\Delta V$.

Figures 2A, 2B:
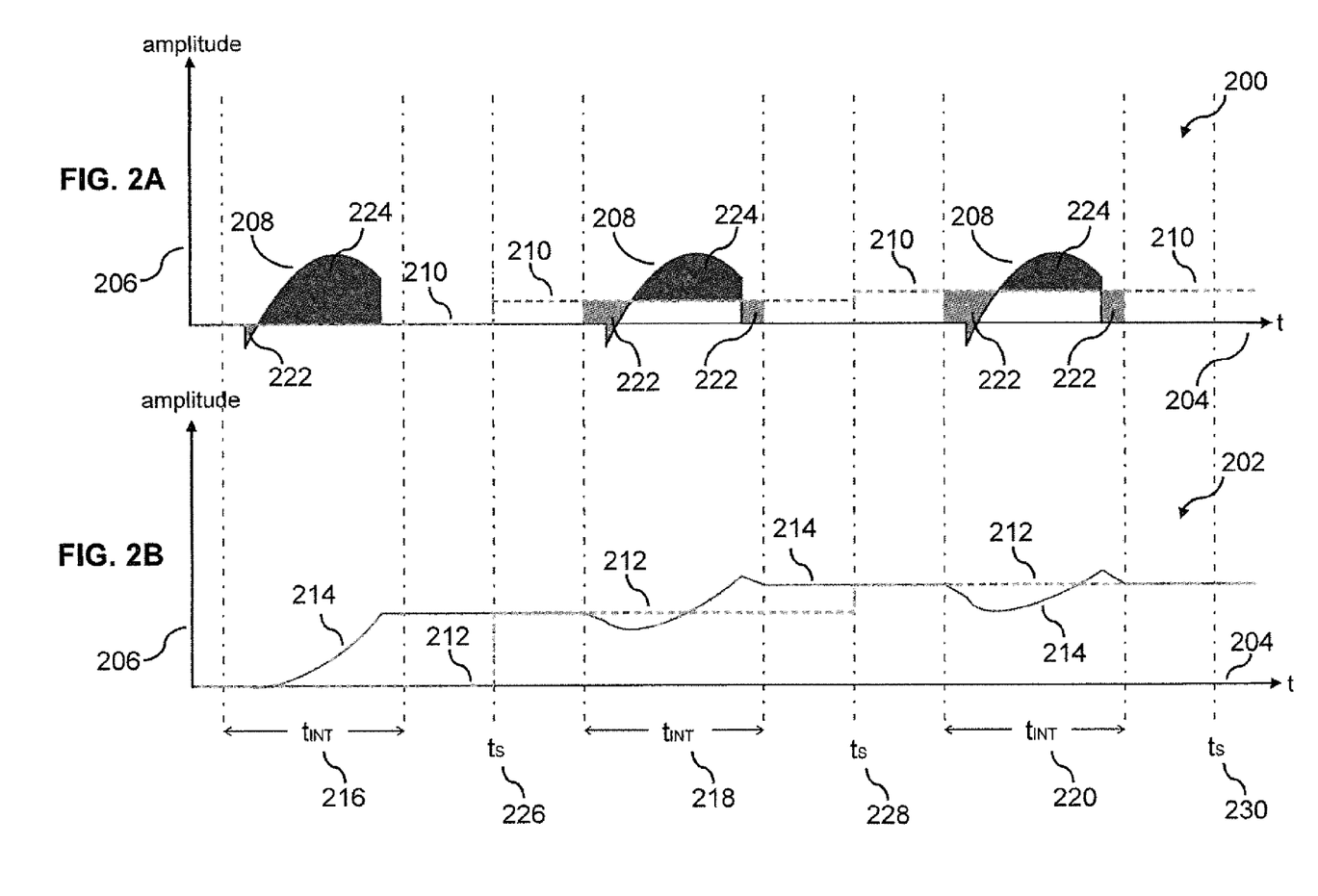
FIGS. 2A and 2B show exemplary signal sequences at various interfaces during operation of the circuit shown in FIG. 1.

The operation of the circuit 100 according to various embodiments will be described in the following with reference to exemplary signal sequences at various interfaces within the circuit 100 which are shown in FIG. 2A and FIG. 2B.

A representation 208 of the input signal provided at the input 102 of the circuit 100 (input signal 208 in the following) and a representation 210 of the scaled or divided output signal from the S/H circuit 110 in the circuit 100 (scaled S/H output signal 210 in the following) are shown in diagram 200 of FIG. 2A. A representation 212 of the output signal from the S/H circuit 110 in the circuit 100 (S/H output signal 212 in the following) and a representation 214 of the output signal from the integrator 108 in the circuit 100 (integrator output signal 214 in the following) are shown in diagram 202 of FIG. 2B. In the diagrams shown in FIG. 2A and FIG. 2B, the x-axis 204 represent time. An actual scaling of the x-axis 204 is omitted, however, distinct times or time intervals which will be referred to in the following are marked or are bound by perpendicular lines intersecting the x-axes. The y-axis 206 represents an amplitude of the various signals shown in the diagrams, wherein signals lying above the x-axis have positive values and signals lying under the x-axis have negative values. The x-axis itself marks the zero value level for the signal sequences shown in the two diagrams. An actual scaling of the y-axis 206 is also omitted.

The input signal 208 may for example represent the signal that can be derived from or tapped from a shunt resistor in a lower branch of a half-bridge circuit in LLC converters or lamp ballast arrangements (examples of such arrangements can be taken from FIG. 3 and FIG. 4 and will be described later on). As can be taken from diagram 200 in FIG. 2A, the input signal has non-zero values only during certain periods of time. Those periods of time with a non-vanishing input signal may lie enclosed within integration periods which are generically labelled $t_{int}$, i.e. the time periods or time intervals during which the switch 106 is present in its closed state such that the input of the integrator 108 is activated and during which the integration is performed by the integrator 108. The duration of the integration period $t_{int}$ may correspond to 50% of a full cycle. The term cycle refers to the cycle of the half-bridge circuit to which the input 102 of the circuit 100 may be coupled and from which the input signal 208 may be derived. A cycle corresponds to time span between the beginning of one integration time interval $t_{int}$ and the beginning of the following integration time interval $t_{int}$. Outside of the integration periods $t_{int}$ the input signal 208 corresponds to zero, as can be taken from diagram 200 in FIG. 2A. Furthermore, outside of the integration periods $t_{int}$ the switch 106 may be present in its opened state and thus the input of the integrator 108 may be deactivated such that the integration is not performed outside of the integration periods $t_{int}$.

In the beginning of the first integration period $t_{int}$, also labelled 216, which for example may lie at the beginning of the cycle of the half-bridge circuit, the integrator 108 is not "precharged", i.e. it is in a reset state and hence its output signal is equal to zero as long as the signal at the input of the integrator 108 is equal to zero. The signal fed into the integrator 108 corresponds to the difference between the input signal 208 and the signal provided at the second input of the subtractor 104 which is represented by the scaled S/H output signal 210 shown in diagram 200 in FIG. 2A. During the first integration period 216 the scaled S/H output signal 210 is zero. Therefore, the integrator 108 directly integrates the input signal 208. Parts of the input signal 208 enclosing a negative integrating area 222 with the scaled S/H output signal 210 (which in the first integration period 216 coincides with the x-axis), i.e. an area which lies under the curve representing the scaled S/H output signal 210, cause the integrator output signal 214 to decrease. Conversely, parts of the input signal 208 enclosing a positive integration area 224 with the scaled S/H output signal 210 (which in the first integration period 216 coincides with the x-axis), i.e. an area which lies above the curve representing the scaled S/H output signal 210, cause the integrator output signal 214 to increase. Since the positive area 224 in the first integration period 216 is larger than the negative area 222 in the first integration period 216 the integrator output signal 214 has a positive value at the end of the first integration period 216. At the end of the first integration period 216 the input of the integrator 108 is deactivated, e.g. by opening the switch 106, and the output signal 214 of the integrator 108 is maintained, i.e. the output signal 214 keeps the value acquired at the end of the first integration period 216 until the end of the integration period 216. At a first sampling time 226 (generically, a sampling time is labelled $t_s$) following the first integration period 216 within the first cycle the S/H circuit 110 samples the integrator output signal 214 and hence at the first sampling time 226 the S/H output signal 212 changes from its initially held zero-value to the value of the integrator output signal 214. Correspondingly, at the same time the scaled S/H output signal 210 that is provided to the subtractor 104 as subtrahend signal changes from its initially held zero-value to a non-zero value (as it is a scaled version of the S/H output signal 212).

In the second integration period 218 which marks the beginning of the second cycle the signal to be integrated by the integrator 108 corresponds to the difference of the input signal 208 and the scaled S/H output signal 210. However, in contrast to the first integration period 216 in the first cycle, the scaled S/H output signal 210 during the second integration period 218 in the second cycle does not coincide with the x-axis since it has acquired a non-zero value at the first sampling time 226 in the first cycle. Since the input signal 208 in the second integration period 218 is identical to the input signal 208 in the first integration period 216, as can be taken from diagram 200 in FIG. 2A, but the scaled S/H output signal 210 has increased, the negative area 222 (including two regions contributing to the negative area 222 as can be seen in diagram 200 in FIG. 2A) in the second integration period 218 is increased and the positive integrating area 224 in the second integration period 218 is decreased with respect to the corresponding areas in the first integration period 216. In the second integration interval 218 the positive integrating area 224 is still larger than the negative area 222, thus the integrator output 208 is further increased until the end of the second integration period 218. At a second sampling time 228 (following the second integration period 218 within the second cycle) the S/H circuit 110 samples the integrator output signal 214 and hence the S/H output signal 212 is further increased from its non-zero value acquired at the first sampling time 226 to the larger value of the integrator output signal 214 at the second sampling time 228. Correspondingly, at the second sampling time 228 the scaled S/H output signal 210 is increased from its non-zero value acquired at the first sampling time 226 to a larger value.

In the third cycle, the process just described with reference to the first cycle and the second cycle takes place in an analogous manner. In the third integration period 220 the scaled S/H output signal 210, being the reference signal for the comparison performed by the subtractor 104, is at a level which renders the positive integrating area 224 to be equal to the negative integrating area 222 (again including two regions contributing to the negative area 222 as was the case in the second integration period 218) such that their effects on the output signal of the integrator 108 cancel each other out. In the end, the integrator output signal 214 at the end of the third integration period 220 is equal to the integrator output signal 214 at the beginning of the third integration period 220. Therefore, the S/H output signal 212 and the scaled S/H output signal 210 derived therefrom are not changed at a third sampling time 230 following the third integration period 220.

Figure 3:
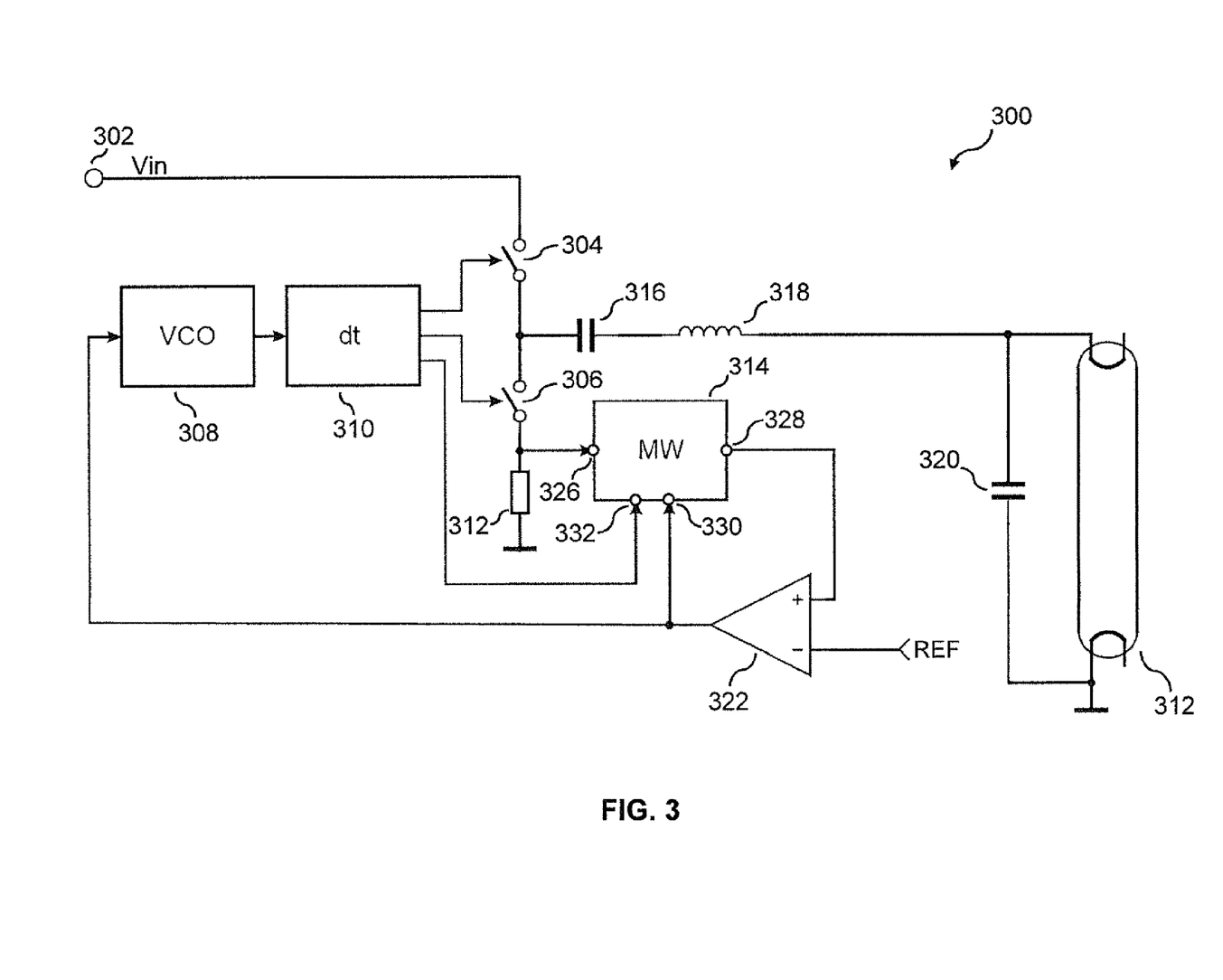
FIG. 3 shows an implementation of a lamp ballast arrangement in accordance with various embodiments.

A practical example of a possible application of the circuit 100 for determining an average value of a quasiperiodic signal according to various embodiments is shown in FIG. 3 in the form of a lamp ballast arrangement in which the circuit 100 may be used for power control.

The lamp ballast arrangement 300 may include an input 302 which is coupled to a reference potential, e.g. the ground potential, via a series arrangement including a first switch 304, a second switch 306 and a shunt resistor 312. A tap arranged between the first switch 304 and the second switch 306 is coupled via a series arrangement including a first capacitor 316 and a coil 318 to one contact of a light emitter 324 which may be any kind of lamp, e.g. a fluorescent lamp, and via a series arrangement including the first capacitor 316, the coil 318 and a second capacitor 320 to another contact of the light emitter. The other contact of the light emitter may be further coupled to the reference potential, e.g. the ground potential. A tap arranged between the second switch 306 and the shunt resistor 312 may be coupled to a first input 326 of an averaging circuit. An output 328 of the averaging circuit 314 may be coupled to one input of a comparing circuit 322. A reference signal REF may be coupled to the other input of the comparing circuit 322. The comparing circuit may for example be formed as a differential amplifier. An output of the comparing circuit 322 may be coupled to a second input 330 of the averaging circuit 314 and to an input of a frequency generator 308, e.g. a VCO (voltage controlled oscillator). An output of the frequency generator 308 may be coupled to an input of a dead-time generator 310. The dead-time generator 310 may be coupled to a control input of the first switch 304 and to a control input of the second switch 306 and further to a third input 332 of the averaging circuit 314.

A controlled DC input voltage VIN (or correspondingly a DC input current) may be coupled to the half-bridge including the first switch 304 and the second switch 306. The switches are controlled by the frequency generator 308 and the dead-time generator 310 and may be alternately turned on (i.e. set into a conducting state) for periods of time which may be dependent on the frequency of the clock signal provided by the frequency generator 308. In other words, the on-times and off-times of the switches are mutually exclusive (i.e. when one switch is on the other one is off) such that either the reference potential or the input voltage VIN is provided at the tap between the first switch 304 and the second switch 306. The dead-time generator 310 is configured to provide a turn-off signal or dead-time signal to the switches thereby defining a dead-time during which both switches remain turned-off. The dead-times of the switches are interposed between the on-times of the switches. In this way, the half-bridge circuit within the lamp ballast arrangement 300 may be configured to transform the constant input voltage VIN in a switching manner into a, to a first approximation, alternating square-wave voltage which is provided at the tap arranged between the first switch 304 and the second switch 306. The amplitude of the alternating square wave-voltage may correspond to half the amplitude of the input voltage VIN. The alternating square wave-voltage may be then provided to the light emitter 324 via a matching network including the first capacitor 316, the inductor 318 and the second capacitor 320. The first capacitor 316 may be configured to filter out DC voltage components from the voltage provided at the tap arranged between the first switch 304 and the second switch 306. The inductor 318 may be configured to limit the current provided to the light emitter 324 depending on the frequency of the clock signal which is provided by the frequency generator 308.

A voltage proportional to the current flowing through the second switch 306 is sampled at the tap arranged between the shunt resistor 312 and the second switch 306 and is provided at the first input 326 of the averaging circuit 314. The averaging circuit 314 may correspond to the circuit 100 for determining an average value of a quasiperiodic signal shown in FIG. 1. The first input 326 of the averaging circuit 314 may correspond to the first input 102 of the circuit 100 in FIG. 1 and the output 328 of the averaging circuit 314 may correspond to the output 112 of the circuit 100 shown in FIG. 1. The functionality and the advantages of the averaging circuit 314 may correspond to those of the circuit 100 for determining an average value of a quasiperiodic signal shown in FIG. 1 and therefore will not be repeated as they have been described with respect to FIG. 2, for example.

The output signal of the averaging circuit 314 provided at its output 328 therefore represents an average of the signal provided at its input which in turn is proportional to the current flowing through the second switch 306. The comparing circuit 322 is configured to compare the output signal of the averaging circuit 314 to the reference signal REF. The result of this comparison is used to adjust the frequency of the clock signal generated by the frequency generator 308. In this case, the reference signal REF may be proportional to a power that is to be applied to the light emitter 324. The output signal of the comparing circuit 322 may be applied to the input of the frequency generator 308 via a controller, e.g. a PI (proportional-integral) controller or a PID (proportional-integral-differential) controller. The output signal of the comparing circuit 322 may be further coupled to the second input 330 of the averaging circuit 314 for adjusting an integrator time constant of the integrator within the averaging circuit 314. Apart from being configured to control the on-times and dead times of the switches, the dead-time generator 310 is further configured to provide one or more signals to the third input or multi-terminal input 332 of the averaging circuit 314 which may control the duration of the integration periods $t_{int}$ and the position of the sampling times $t_s$ within the corresponding cycles (see FIG. 2A and FIG. 2B).

The power consumption of the half-bridge at constant input voltage VIN can be obtained from the product of the input voltage VIN and the average value of the consumed current, i.e. of the current flowing through the half-bridge. The output current of the half-bridge that is applied to the light emitter 324 is free of DC current components due to the capacitor 316 provided in the electrical path between the tap arranged between the first switch 304 and second switch 306 and the light emitter 324. Therefore, the average value of the consumed current can be determined based on the current flowing through either the first switch 304 or the second switch 306.

Since the efficiency of the half-bridge and the various other electrical components (omitted in the figure) supporting the operation of the light emitter 324 is very high, their potential losses can be neglected and thus the average value of the current flowing through the second switch 306 is a good enough indicator of the power consumed by the light emitter 324.

In the same way the output power of a LLC converter can be controlled such that it remains at a constant value.

For LLC converters a further modification may be provided which is described with reference to FIG. 4. To a large extent, the LLC converter arrangement 400 shown in FIG. 4 corresponds to the lamp ballast arrangement 300 shown in FIG. 3. Therefore, the same components carry the same reference numbers and their functionality in the context of the LLC converter is the same. The output current of the half-bridge in the LLC circuit 400 is applied to one side of a primary winding of a transformer 402, the other side of the primary winding of the transformer 402 is coupled to a reference potential, e.g. the ground potential, via a second capacitor 408. The primary winding is inductively coupled to a secondary winding of the transformer 402, e.g. by means of a magnetic core. One end of the secondary winding is coupled via a first diode 410 to a first output terminal 404 of the LLC converter 400 and to a first input of a second comparing circuit 418, the other end of the secondary winding is coupled via a second diode 414 to the first output terminal 404 of the LLC converter 400 and to the first input of the second comparing circuit 418. The second comparing circuit 418, much like the first comparing circuit 322, may for example be formed as a differential amplifier. A center tap is provided on the secondary winding of the transformer 402 and coupled to a second output terminal 406 of the LLC converter 400, to the first output terminal 404 via a third capacitor 412 and to one contact of a constant voltage source 416. The other contact of the constant voltage source 416 is coupled to a second input of the second comparing circuit 418. An output of the second comparing circuit 418 is coupled to the other input of the first comparing circuit 322. In comparison to the configuration of the lamp ballast arrangement 300 shown in FIG. 3, the output signal of the second comparing circuit 418 is replaced for the reference signal REF.

The LLC converter arrangement 400 is configured to convert the input voltage VIN into a reduced output voltage which is provided at the first output terminal 404 and the second output terminal 406. The LLC converter arrangement 400 has two control circuits: an inner control circuit including the half-bridge (i.e. the first switch 304 and the second switch 306), the shunt resistor 312, the averaging circuit 314, the frequency generator 308 and the dead time generator 310 and an outer control circuit essentially including the second comparing circuit 418, the constant voltage source 416. The outer control circuit is configured to adjust the output voltage and to generate an output signal by the means of the second comparing circuit 418 which serves as an interim reference signal. The interim reference signal serves as a reference signal for the first comparing circuit 322 arranged in the inner control circuit. Therefore, the frequency of the frequency generator may be adjusted such that the voltage provided at the outputs of the LLC converter circuit 400 corresponds to the desired preset value, which is obtained from the constant voltage source 416.

The output power of a LLC converter is strongly nonlinearly dependent on the frequency of the VCO. In the LLC converter arrangement 400 according to various embodiments, this relation may be linearized such that the control of the output voltage by the outer control circuit during a change of load may become more predictable.

Figure 4:
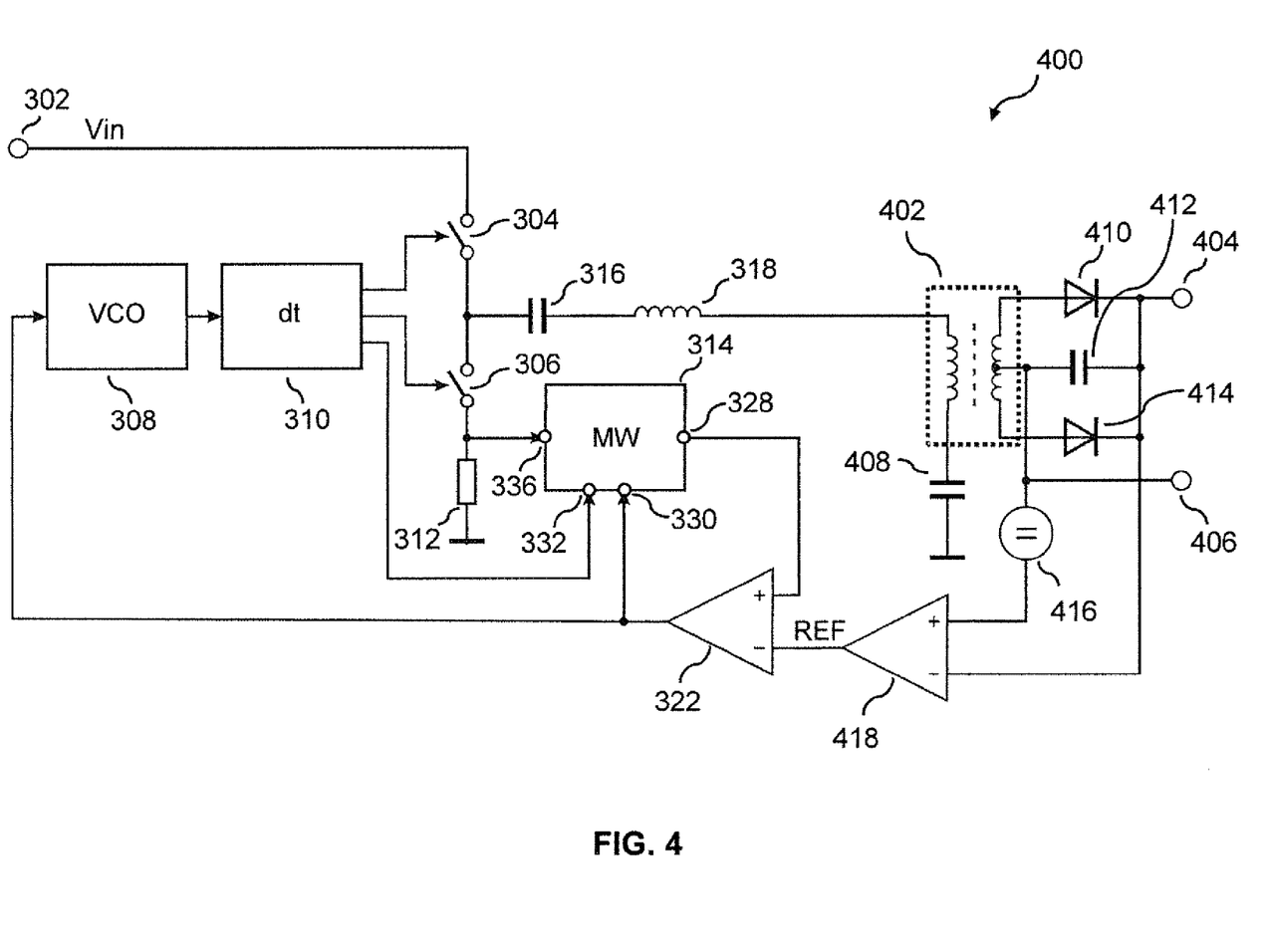
FIG. 4 shows an implementation of an LLC converter arrangement in accordance with various embodiments.

In FIG. 3 and in FIG. 4 two out of many possible applications for the circuit for determining an average value of a quasiperiodic signal have been presented. In both cases, the input signal provided at the a first input 326 of the averaging circuit 314 (being equivalent to the input 102 of the circuit 100 shown in FIG. 1) is proportional to a current flowing through the half-bridge of the circuit arrangement the half-bridge is embedded into. As has been explained using the exemplary signal pulses shown in FIG. 2A and FIG. 2B, the integrator 108 of the circuit 100 may integrate the difference between the input signal 208 and a variable reference signal, which may correspond to the attenuated or scaled output signal of the circuit 100 according to various embodiments shown in FIG. 1 and which is represented by the scaled S/H output signal 210 in diagram 200 in FIG. 2A. In the following further aspects relating to the operation and advantages of the circuit for determining an average value of a quasiperiodic signal according to various embodiments in combination with a half-bridge of a lamp ballast arrangement 300 as shown in FIG. 3 or an LLC converter arrangement 400 as shown in FIG. 4 will be described. It is to be understood that the various effects and advantages inherent in the circuit 100 are equally present in the lamp ballast arrangement 300 and/or the LLC converter circuit 400 by way of inheritance.

The input of the integrator 108 may be switchable. When the input of the integrator 108 is switched off, the integrator is not reset but maintains its state, i.e. the signal output is not affected by the switching off of the input of the integrator 108. The integrator 108 may remain switched off, i.e. the input of the integrator 108 may remain switched off, during a period of time during each cycle which is in a fixed proportion to the cycle duration, i.e. the ratio of the switch-off time to the cycle duration may be fixed. During the switch-off time the current in the considered branch of the associated half-bridge circuit may be expected to be zero. As mentioned previously, in the above example the switch-off time may for example correspond to 50% of the cycle duration.

The S/H circuit 110 may acquire or sample the state, i.e. the output signal, of the integrator 108 once in each cycle at a sampling time $t_s$ during a time when the input of the integrator 108 is switched off and the output signal of the integrator 108 does not change. The output signal of the S/H circuit 110 may be used to derive the variable reference signal which is provided to the subtractor 104. In this context, deriving may include attenuating the signal before applying it to the subtractor 104.

The integrator 104 with its switchable input and the S/H circuit 110 form a time-discrete control circuit. As long as the input signal 208, which is averaged during the integrating period, is either larger or smaller than the variable reference signal, e.g. the scaled S/H output signal 210, the signal output by the integrator, e.g. the integrator output signal 214, will continuously grow larger or smaller until the end of the corresponding integrating period $t_{int}$. Since the S/H circuit 110 updates the stored value, e.g. the S/H output signal 212 in diagram 202 in FIG. 2B in every cycle, the variable reference value will successively approach the average value of the input signal provided at the input of the circuit 100 shown in FIG. 1 (multiplied with the inverse of the ratio of the integrating time $t_{int}$ and the cycle duration). In the steady state (i.e. after the settling time has elapsed) the variable reference value may represent an average of the current of the half-bridge circuit, for example.

The circuit 100 for determining an average value of a quasiperiodic signal according to various embodiments may be used in both the lamp ballast arrangement 300 and/or the LLC converter arrangement 400 when the current through the half-bridge circuit is at least quasiperiodic and the integrator time constant of the integrator 108 is large enough. The larger the integrator time constant, the smaller the steps in which the variable reference signal will approach the actual average value of the current through the half-bridge.

The variable reference signal reaches its steady state value which corresponds to an average value of the input signal in increasingly shorter times when the integrator time constant of the integrator 108 is reduced. At a certain integrator time constant the variable reference signal reaches its steady state value within one cycle and thus does not contain information about previous cycles. In that case the variable reference signal corresponds to the average of the current in the half-bridge circuit of the preceding cycle.

If the integrator time constant of the integrator 108 is chosen too small, the settling process features overshooting and ringing. If the integrator time constant is reduced below half the value which results in an optimal transient response, the control circuit may become unstable.

The operating frequency of the half-bridge-circuit in the LLC converters or lamp ballasts is variable. In order for the circuit 100 to be configured to provide a quickly settling average value at any operating frequency of the half-bridge, the integrator time constant may be chosen to approximately correspond to the optimal value, i.e. the value of the integrator time constant resulting in an optimal transient response of the integrator 108. In the circuit 100 for determining an average value of a quasiperiodic signal according to various embodiments, the actual value of the integrator time constant does not affect the result of the averaging process in the settled state of the integrator 108. The actual value of the integrator time constant may only affect the transient response.

Usually, the generated operating frequency of the half-bridge circuit is known in a control circuit. That is, an analog or digital control signal is provided which is used to set the operating frequency of the half-bridge. In the circuit 100 for determining an average value of a quasiperiodic signal according to various embodiments that control signal may be used to set or adjust the integrator time constant. One possible way of setting the integrator time constant may involve toggling capacitances or resistances in order to adjust the integrator time constant in coarse steps, for example by a factor of 2 or by a factor of 1.25. Another possible way may involve a multiplying DAC (digital-to-analog converter) which may be provided in the filter 108 and may be configured to transform the digital control signal into an analog gain which may then be multiplied with different factors. Alternatively, the integrator 108 may be formed as an OTA-C (operational transconductance amplifier-capacitor) filter such that may be configured by the means of an analog signal.

In accordance with an implementation of an embodiment a circuit for determining an average value of a quasiperiodic signal may include an integrator, a sample and hold circuit coupled to an output of the integrator, wherein the sample and hold circuit includes a sample and hold circuit output, a feedback path coupled to the sample and hold circuit output and configured to feedback the signal provided at the sample and hold circuit output as a feedback signal, a subtractor configured to form a difference signal representing the difference between the quasiperiodic signal and the feedback signal, wherein an output of the subtractor is coupled to an input of the integrator to thereby provide the difference signal to the input of the integrator. The circuit for determining an average value of a quasiperiodic signal may be configured to provide at the output of the circuit for determining an average value of a quasiperiodic signal the signal provided at the sample and hold circuit output. In accordance with various embodiments, the sample and hold circuit may include a further output which may be configured to provide an output signal of the circuit for determining an average value of a quasiperiodic signal. In that case, the signal provided at the sample and hold circuit output may correspond to the output signal provided at the further output of the sample and hold circuit or it may correspond to a scaled (i.e. attenuated or amplified) version of the output signal provided at the further output and/or it may correspond to a phase-shifted version of the output signal provided at the further output, wherein an attenuating circuit or an amplifying circuit and/or a phase-shifting circuit may be provided in the sample and hold circuit or may be provided externally in at least one of the signal paths, i.e. the further output signal path and/or the sample and hold circuit output path.

In accordance with another implementation of an embodiment, the circuit may further include an integrator gating element configured to controllably hold the state of the integrator.

In accordance with yet another implementation of an embodiment of the circuit the integrator gating element may include a switch coupled between the output of the subtractor and the input of the integrator.

In accordance with yet another implementation of an embodiment of the circuit the integrator gating element may be a portion of the integrator.

In accordance with yet another implementation of an embodiment the circuit may include an integrator gating element controller configured to provide a gating control signal to the integrator gating element such that the gating control signal has a signal period which is dependent on the signal period of the quasiperiodic signal.

In accordance with yet another implementation of an embodiment of the circuit the integrator gating element controller may be configured to provide a gating control signal to the integrator gating element such that the gating control signal has a duty cycle which is independent from the signal period of the quasiperiodic signal.

In accordance with yet another implementation of an embodiment of the circuit the integrator gating element controller is configured to provide a gating control signal to the integrator gating element such that the integrator gating element is controlled such that a time interval during which the integrator holds its state lies within a time interval during which the quasiperiodic signal is zero.

In accordance with yet another implementation of an embodiment of the circuit the integrator may be configured such that its integrator time constant is controllable. The integrator time constant is a typical time scale related to how fast the output value of the integrator is able to settle after a transient response of an integrator. In the case of an analog RC-integrator circuit, the integrator time constant may correspond to the product of the resistance R of the resistor and the capacitance C of the capacitor and gives the time it takes the voltage across the respective component to adjust to within 1/e of its final value. More generally, the integrator time constant may be defined as the ratio of the input voltage change $\Delta V$ and a rate a rate of change of the output voltage, $\Delta V_{out}/\Delta t$. Assuming that the output voltage change $\Delta V_{out}$ of the integrator may eventually be equal to the input voltage change $\Delta V$, the considered ratio is equal to $\Delta t$, which is defined to be the integrator time constant. In the case of the circuit according to various embodiments, the damping factor of the attenuator and the ratio of the integration period and the cycle duration may be two parameters relevant to the transient response of the inner control circuit. Both parameters remain constant in order for the gain of the control circuit to remain constant. Therefore, the integrator time constant may represent the only variable parameter which can be freely adjusted in order to adjust the transient response of the integrator for a given cycle duration.

In accordance with yet another implementation of an embodiment of the circuit the integrator may be configured such that its integrator time constant is controllable dependent on the time period of the quasiperiodic signal. The integrator time period may be controlled such that it is adjusted proportional to the time period of the quasiperiodic signal. Alternatively, the integrator time period may be controlled such that it is adjusted in steps, wherein the selected step corresponds to the time period of the quasiperiodic signal.

In accordance with various embodiments, a circuit arrangement may include a half bridge circuit and a circuit for determining an average value of a quasiperiodic signal, wherein the circuit is coupled to the half bridge circuit and includes an integrator, a sample and hold circuit coupled to an output of the integrator, wherein the sample and hold circuit includes a sample and hold circuit output, a feedback path coupled to the sample and hold circuit output and configured to feedback the signal provided at the sample and hold circuit output as a feedback signal, a subtractor configured to form a difference signal representing the difference between the quasiperiodic signal and the feedback signal, wherein an output of the subtractor is coupled to an input of the integrator to thereby provide the difference signal to the input of the integrator. According to various embodiments, the circuit for determining an average value of a quasiperiodic signal may be configured to provide at the output of the circuit for determining an average value of a quasiperiodic signal the signal provided at the sample and hold circuit output. In accordance with various embodiments, the sample and hold circuit may include a further output which may be configured to provide an output signal of the circuit arrangement. In that case, the signal provided at the sample and hold circuit output may correspond to the output signal provided at the further output of the sample and hold circuit or it may correspond to a scaled (i.e. attentuated or amplified) version of the output signal provided at the further output and/or it may correspond to a phase-shifted version of the output signal provided at the further output, wherein an attenuating circuit or an amplifying circuit and/or a phase-shifting circuit may be provided in the sample and hold circuit or may be provided externally in at least one of the signal paths, i.e. the further output signal path and/or the sample and hold circuit output path. According to various further embodiments of the circuit arrangement, the half bridge circuit may be coupled to the circuit for determining an average value of a quasiperiodic signal via a signal processing circuit which may be configured to shift DC voltage components (or DC current components) within a signal coupled from the half bridge circuit to the circuit.

In accordance with another embodiment of the circuit arrangement the half-bridge circuit may include two switches coupled in series with each other, wherein the quasiperiodic signal corresponds to a current flowing through one of the switches.

In accordance with yet another embodiment the circuit arrangement may further include a shunt resistor configured to convert the current flowing through one the switches to the quasiperiodic signal.

In accordance with yet another embodiment of the circuit arrangement the current provided at an output of the half-bridge may be free of a DC component, and wherein the average of the quasiperiodic signal provided by the shunt resistor represents the effective power of the half-bridge circuit.

In accordance with yet another embodiment, the circuit arrangement may include an integrator gating element configured to controllably hold the state of the integrator.

In accordance with yet another embodiment, the circuit arrangement may include an integrator gating element controller configured to provide a gating control signal to the integrator gating element such that the gating control signal has a signal period which is dependent on the signal period of the quasiperiodic signal.

In accordance with yet another embodiment of the circuit arrangement, the integrator gating element controller may be configured to provide a gating control signal to the integrator gating element such that the gating control signal has a duty cycle which is independent from the signal period of the quasiperiodic signal.

In accordance with yet another embodiment of the circuit arrangement, the integrator gating element controller may be configured to provide a gating control signal to the integrator gating element such that the integrator gating element is controlled such that a time interval during which the integrator holds its state lies within a time interval during which the quasiperiodic signal is zero.

In accordance with various embodiments, a lamp ballast arrangement may include a lamp ballast configured to provide a power supply to at least one lamp; and a circuit arrangement which may include a half bridge circuit and a circuit for determining an average value of a quasiperiodic signal, wherein the circuit is coupled to the half bridge circuit and includes an integrator, a sample and hold circuit coupled to an output of the integrator, wherein the sample and hold circuit includes a sample and hold circuit output, a feedback path coupled to the sample and hold circuit output and configured to feedback the signal provided at the sample and hold circuit output as a feedback signal, a subtractor configured to form a difference signal representing the difference between the quasiperiodic signal and the feedback signal, wherein an output of the subtractor is coupled to an input of the integrator to thereby provide the difference signal to the input of the integrator. According to various further embodiments, the circuit arrangement may be configured to provide at the output of the circuit arrangement the signal provided at the sample and hold circuit output. In accordance with various embodiments, the sample and hold circuit may include a further output which may be configured to provide an output signal of the circuit arrangement. In that case, the signal provided at the sample and hold circuit output may correspond to the output signal provided at the further output of the sample and hold circuit or it may correspond to a scaled (i.e. attentuated or amplified) version of the output signal provided at the further output and/or it may correspond to a phase-shifted version of the output signal provided at the further output, wherein an attenuating circuit or an amplifying circuit and/or a phase-shifting circuit may be provided in the sample and hold circuit or may be provided externally in at least one of the signal paths, i.e. the further output signal path and/or the sample and hold circuit output path. According to various embodiments of the lamp ballast arrangement, the half bridge circuit may be coupled to the circuit for determining an average value of a quasiperiodic signal via a signal processing circuit which may be configured to shift DC voltage components (or DC current components) within a signal coupled from the half bridge circuit to the circuit.

In accordance with another embodiment the lamp ballast arrangement may further include a shunt resistor configured to convert the current flowing through one the switches to the quasiperiodic signal.

In accordance with yet another embodiment of the lamp ballast arrangement the average of the quasiperiodic signal provided by the shunt resistor may represent the effective power of the half bridge circuit provided to the lamp.

In accordance with yet another embodiment, the lamp ballast arrangement may include an integrator gating element configured to controllably hold the state of the integrator.

In accordance with yet another embodiment, the lamp ballast arrangement may include an integrator gating element controller configured to provide a gating control signal to the integrator gating element such that the gating control signal has a signal period which is dependent on the signal period of the quasiperiodic signal.

In accordance with yet another embodiment of the lamp ballast arrangement, the integrator gating element controller may be configured to provide a gating control signal to the integrator gating element such that the gating control signal has a duty cycle which is independent from the signal period of the quasiperiodic signal.

In accordance with yet another embodiment of the lamp ballast arrangement, the integrator gating element controller may be configured to provide a gating control signal to the integrator gating element such that the integrator gating element is controlled such that a time interval during which the integrator holds its state lies within a time interval during which the quasiperiodic signal is zero.

In accordance with various embodiments, an LLC converter arrangement may include an LLC converter configured to provide a power supply; and a circuit arrangement including a half bridge circuit and a circuit for determining an average value of a quasiperiodic signal, wherein the circuit is coupled to the half bridge circuit and includes an integrator, a sample and hold circuit coupled to an output of the integrator, wherein the sample and hold circuit includes a sample and hold circuit output, a feedback path coupled to the sample and hold circuit output and configured to feedback the signal provided at the sample and hold circuit output as a feedback signal, a subtractor configured to form a difference signal representing the difference between the quasiperiodic signal and the feedback signal, wherein an output of the subtractor is coupled to an input of the integrator to thereby provide the difference signal to the input of the integrator. According to various further embodiments, the circuit arrangement may be configured to provide at the output of the circuit arrangement the signal provided at the sample and hold circuit output. In accordance with various other embodiments, the sample and hold circuit may include a further output which may be configured to provide an output signal of the circuit arrangement. In that case, the signal provided at the sample and hold circuit output may correspond to the output signal provided at the further output of the sample and hold circuit or it may correspond to a scaled (i.e. attentuated or amplified) version of the output signal provided at the further output and/or it may correspond to a phase-shifted version of the output signal provided at the further output, wherein an attenuating circuit or an amplifying circuit and/or a phase-shifting circuit may be provided in the sample and hold circuit or may be provided externally in at least one of the signal paths, i.e. the further output signal path and/or the sample and hold circuit output path. According to various further embodiments of the LLC converter arrangement, the half bridge circuit may be coupled to the circuit for determining an average value of a quasiperiodic signal via a signal processing circuit which may be configured to shift DC voltage components (or DC current components) within a signal coupled from the half bridge circuit to the circuit.

In accordance with another embodiment the LLC converter arrangement may further include a shunt resistor configured to convert the current flowing through one the switches to the quasiperiodic signal.

In accordance with yet another embodiment of the LLC converter arrangement the average of the quasiperiodic signal provided by the shunt resistor may represent the effective power of the half bridge circuit provided to a load.

In accordance with various embodiments of a use of the circuit arrangement the current provided at an output of the half bridge may be free of a DC component.

In accordance with yet another embodiment, the LLC converter arrangement may include an integrator gating element configured to controllably hold the state of the integrator.

In accordance with yet another embodiment, the LLC converter arrangement may include an integrator gating element controller configured to provide a gating control signal to the integrator gating element such that the gating control signal has a signal period which is dependent on the signal period of the quasiperiodic signal.

In accordance with yet another embodiment of the LLC converter arrangement, the integrator gating element controller may be configured to provide a gating control signal to the integrator gating element such that the gating control signal has a duty cycle which is independent from the signal period of the quasiperiodic signal.

In accordance with yet another embodiment of the LLC converter arrangement, the integrator gating element controller may be configured to provide a gating control signal to the integrator gating element such that the integrator gating element is controlled such that a time interval during which the integrator holds its state lies within a time interval during which the quasiperiodic signal is zero.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit for determining an average value of a quasiperiodic signal, the circuit comprising:

an integrator;

an integrator gating element configured to controllably hold the state of the integrator;

an integrator gating element controller configured to provide a gating control signal to the integrator gating element such that the gating control signal has a signal period which is dependent on the signal period of the quasiperiodic signal;

a sample and hold circuit coupled to an output of the integrator, wherein the sample and hold circuit comprises a sample and hold circuit output;

a feedback path coupled to the sample and hold circuit output and configured to feedback the signal provided at the sample and hold circuit output as a feedback signal;

a subtractor configured to form a difference signal representing the difference between the quasiperiodic signal and the feedback signal;

wherein an output of the subtractor is coupled to an input of the integrator to thereby provide the difference signal to the input of the integrator.

2. The circuit of claim 1,
wherein the integrator gating element comprises a switch coupled between the output of the subtractor and the input of the integrator.

3. The circuit of claim 1,
wherein the integrator gating element is a portion of the integrator.

4. The circuit of claim 1,
wherein the integrator gating element controller is configured to provide a gating control signal to the integrator gating element such that the gating control signal has a duty cycle which is independent from the signal period of the quasiperiodic signal.

5. The circuit of claim 1,
wherein the integrator gating element controller is configured to provide a gating control signal to the integrator gating element such that the integrator gating element is controlled such that a time interval during which the integrator holds its state lies within a time interval during which the quasiperiodic signal is zero.

6. The circuit of claim 1,
wherein the integrator is configured such that its integrator time constant is controllable.

7. The circuit of claim 6,
wherein the integrator is configured such that its integrator time constant is controllable dependent on the time period of the quasiperiodic signal.

8. A circuit arrangement, comprising:
a half bridge circuit, wherein the half bridge circuit comprises two switches coupled in series with each other; and
a circuit for determining an average value of a quasiperiodic signal, wherein the circuit is coupled to the half bridge circuit and the quasiperiodic signal corresponds to a current flowing through one of the switches in the half bridge circuit and comprises:
an integrator;
a sample and hold circuit coupled to an output of the integrator, wherein the sample and hold circuit comprises a sample and hold circuit output;
a feedback path coupled to the sample and hold circuit output and configured to feedback the signal provided at the sample and hold circuit output as a feedback signal;
a subtractor configured to form a difference signal representing the difference between the quasiperiodic signal and the feedback signal;
wherein an output of the subtractor is coupled to an input of the integrator to thereby provide the difference signal to the input of the integrator.

9. The circuit arrangement of claim 8, further comprising:
a shunt resistor configured to convert the current flowing through one of the switches to the quasiperiodic signal.

10. The circuit arrangement of claim 9,
wherein the current provided at an output of the half bridge is free of a DC component; and
wherein the average of the quasiperiodic signal provided by the shunt resistor represents the effective power of the half bridge circuit.

11. The circuit arrangement of claim 9, further comprising:
an integrator gating element configured to controllably hold the state of the integrator.

12. The circuit arrangement of claim 11, further comprising:
an integrator gating element controller configured to provide a gating control signal to the integrator gating element such that the gating control signal has a signal period which is dependent on the signal period of the quasiperiodic signal.

13. The circuit arrangement of claim 12,
wherein the integrator gating element controller is configured to provide a gating control signal to the integrator gating element such that the gating control signal has a duty cycle which is independent from the signal period of the quasiperiodic signal.

14. The circuit arrangement of claim 12,
wherein the integrator gating element controller is configured to provide a gating control signal to the integrator gating element such that the integrator gating element is controlled such that a time interval during which the integrator holds its state lies within a time interval during which the quasiperiodic signal is zero.

15. A use of the circuit arrangement of claim 8 for determining the effective power of the half bridge circuit,
wherein the current provided at an output of the half bridge is free of a DC component.

16. A lamp ballast arrangement, comprising:
a lamp ballast configured to provide a power supply to at least one lamp; and
a circuit arrangement, comprising:
a half bridge circuit; and
a circuit for determining an average value of a quasiperiodic signal, wherein the circuit is coupled to the half bridge circuit and comprises:
an integrator;
a sample and hold circuit coupled to an output of the integrator, wherein the sample and hold circuit comprises a sample and hold circuit output;
a feedback path coupled to the sample and hold circuit output and configured to feedback the signal provided at the sample and hold circuit output as a feedback signal;
a subtractor configured to form a difference signal representing the difference between the quasiperiodic signal and the feedback signal;
wherein an output of the subtractor is coupled to an input of the integrator to thereby provide the difference signal to the input of the integrator.

17. The lamp ballast arrangement of claim 16, further comprising:
a shunt resistor configured to convert the current flowing through one of the switches to the quasiperiodic signal.

18. The lamp ballast arrangement of claim 17,
wherein the average of the quasiperiodic signal provided by the shunt resistor represents the effective power of the half bridge circuit provided to the lamp.

19. The lamp ballast arrangement of claim 17, further comprising:
an integrator gating element configured to controllably hold the state of the integrator.

20. The lamp ballast arrangement of claim 19, further comprising:
an integrator gating element controller configured to provide a gating control signal to the integrator gating element such that the gating control signal has a signal period which is dependent on the signal period of the quasiperiodic signal.

21. The lamp ballast arrangement of claim 20,
wherein the integrator gating element controller is configured to provide a gating control signal to the integrator gating element such that the gating control signal has a duty cycle which is independent from the signal period of the quasiperiodic signal.

22. The lamp ballast arrangement of claim 20,
wherein the integrator gating element controller is configured to provide a gating control signal to the integrator gating element such that the integrator gating element is controlled such that a time interval during which the integrator holds its state lies within a time interval during which the quasiperiodic signal is zero.

23. An inductor-inductor-capacitor (LLC) converter arrangement, comprising:
an LLC converter configured to provide a power supply; and
a circuit arrangement, comprising:
a half bridge circuit; and
a circuit for determining an average value of a quasiperiodic wherein the circuit is coupled to the half bridge circuit and comprises:
an integrator;
a sample and hold circuit coupled to an output of the integrator, wherein the sample and hold circuit comprises a sample and hold circuit output;
a feedback path coupled to the sample and hold circuit output and configured to feedback the signal provided at the sample and hold circuit output as a feedback signal;
a subtractor configured to form a difference signal representing the difference between the quasiperiodic signal and the feedback signal;
wherein an output of the subtractor is coupled to an input of the integrator to thereby provide the difference signal to the input of the integrator.

24. The LLC converter arrangement of claim 23, further comprising:
a shunt resistor configured to convert the current flowing through one of the switches to the quasiperiodic signal.

25. The LLC converter arrangement of claim 24,
wherein the average of the quasiperiodic signal provided by the shunt resistor represents the effective power of the half bridge circuit provided to a load.

26. The LLC converter arrangement of claim 24, further comprising:
an integrator gating element configured to controllably hold the state of the integrator.

27. The LLC converter arrangement of claim 26, further comprising:
an integrator gating element controller configured to provide a gating control signal to the integrator gating element such that the gating control signal has a signal period which is dependent on the signal period of the quasiperiodic signal.

28. The LLC converter arrangement of claim 27,
wherein the integrator gating element controller is configured to provide a gating control signal to the integrator gating element such that the gating control signal has a duty cycle which is independent from the signal period of the quasiperiodic signal.

29. The LLC converter arrangement of claim 27,
wherein the integrator gating element controller is configured to provide a gating control signal to the integrator gating element such that the integrator gating element is controlled such that a time interval during which the integrator holds its state lies within a time interval during which the quasiperiodic signal is zero.

* * * * *

UNITED STATES PATENT AND TRADEMARK OFFICE
CERTIFICATE OF CORRECTION

PATENT NO.       : 8,638,048 B2
APPLICATION NO.  : 13/084595
DATED            : January 28, 2014
INVENTOR(S)      : Martin Feldtkeller It is certified that error appears in the above-identified patent and that said Letters Patent is hereby corrected as shown below:

In the Claims

Col. 17, line 36-37, claim 23, write -- average value of a quasiperiodic signal, -- instead of "average value of a quasiperiodic".

Signed and Sealed this
Twenty-fourth Day of February, 2015

Michelle K. Lee
*Deputy Director of the United States Patent and Trademark Office*